US008421539B2

(12) United States Patent
Zhang et al.

(10) Patent No.: US 8,421,539 B2
(45) Date of Patent: *Apr. 16, 2013

(54) MULTI-MODE HIGH EFFICIENCY LINEAR POWER AMPLIFIER

(75) Inventors: Guohao Zhang, Irvine, CA (US); Shiaw W. Chang, Thousand Oaks, CA (US); Xuejun Chen, Moorpark, CA (US); Jing Sun, Moorpark, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/285,276

(22) Filed: Oct. 31, 2011

(65) Prior Publication Data
US 2012/0044980 A1    Feb. 23, 2012

Related U.S. Application Data

(63) Continuation of application No. 12/985,373, filed on Jan. 6, 2011, now Pat. No. 8,049,565, which is a continuation of application No. 12/273,093, filed on Nov. 18, 2008, now Pat. No. 7,876, 160.

(60) Provisional application No. 61/025,965, filed on Feb. 4, 2008.

(51) Int. Cl.
*H03F 3/68* (2006.01)

(52) U.S. Cl.
USPC ............................ 330/295; 330/124 R; 330/51

(58) Field of Classification Search .............. 330/124 R, 330/295
See application file for complete search history.

(56) References Cited

U.S. PATENT DOCUMENTS

| 4,803,443 | A  | * | 2/1989  | Takagi et al. ................. 330/277 |
| 5,541,554 | A  |   | 7/1996  | Stengel et al. |
| 6,366,788 | B1 |   | 4/2002  | Fujioka et al. |
| 6,472,935 | B2 |   | 10/2002 | King et al. |
| 6,954,623 | B2 |   | 10/2005 | Chang et al. |
| 7,071,873 | B2 |   | 7/2006  | Tomasic et al. |
| 7,193,472 | B2 |   | 3/2007  | Gotou et al. |
| 7,345,537 | B2 | * | 3/2008  | Apel et al. ..................... 330/134 |
| 7,876,160 | B2 | * | 1/2011  | Zhang et al. .................. 330/295 |
| 7,912,499 | B2 | * | 3/2011  | Ouzillou .................... 455/556.1 |
| 8,049,565 | B2 | * | 11/2011 | Zhang et al. .................. 330/295 |
| 2002/0186079 | A1 | | 12/2002 | Kobayashi |
| 2007/0165743 | A1 | | 7/2007 | McCallister et al. |
| 2008/0048774 | A1 | | 2/2008 | Chang et al. |
| 2011/0095828 | A1 | | 4/2011 | Zhang et al. |

FOREIGN PATENT DOCUMENTS

WO    WO 2004/084422 A2    9/2004

* cited by examiner

*Primary Examiner* — Robert Pascal
*Assistant Examiner* — Khiem Nguyen
(74) *Attorney, Agent, or Firm* — Knobbe, Martens, Olson & Bear, LLP (57) ABSTRACT

A power amplifier includes a plurality of amplification paths in which at least one amplification path is selectively enabled and disabled, wherein each amplification path includes an output impedance modification element and an output phase shift element that is operable independently from the output impedance modification element, and wherein the output impedance modification element in each amplification path provides selective impedance for each amplification path.

17 Claims, 6 Drawing Sheets

MULTI-MODE HIGH EFFICIENCY LINEAR POWER AMPLIFIER

This application is a continuation of U.S. application Ser. No. 12/985,373, filed Jan. 6, 2011, entitled "MULTI-MODE HIGH EFFICIENCY LINEAR POWER AMPLIFIER", which is a continuation of U.S. application Ser. No. 12/273,093, filed Nov. 18, 2008, entitled "MULTI-MODE HIGH EFFICIENCY LINEAR POWER AMPLIFIER", now U.S. Pat. No. 7,876,160, and claims the benefit of priority under 35 U.S.C. §119(e) of U.S. Provisional Patent Application No. 61/025,965, filed Feb. 4, 2008, entitled "Dual Mode Efficiency Enhanced Linear Power Amplifier (PA)," the entireties of which are hereby incorporated herein by reference as to be considered part of this specification.

BACKGROUND

Portable communication devices, such as cellular telephones, personal digital assistants (PDAs), WIFI transceivers, and other communication devices transmit and receive communication signal at various frequencies that correspond to different communication bands and at varying power levels. A power amplifier module, generally comprising one or more amplification stages, is used to transmit the communication signals. A radio frequency (RF) power amplifier system may include multiple amplification stages, and, in some applications, multiple amplification paths. The efficiency of the power amplifier system is generally determined by a number of factors, and to a large degree, determines the amount of power consumed by the power amplifier system.

Various ways of measuring and determining the efficiency of the power amplifier are available. One measure of power amplifier efficiency is referred to as "power added efficiency," abbreviated as PAE. The PAE of a power amplifier is dependent upon a number of factors including, but not limited to, the number of power amplification paths if the power amplifier system is a dual mode power amplifier, the load impedance at the output of the power amplifier path or paths, impedance matching between multiple stages, and other factors. In a multiple mode power amplification topology, in which two or more power amplification paths are implemented to provide varying power output levels, improving the PAE at low power levels is typically achieved at the expense of power amplifier linearity at higher power levels.

Therefore, it is desirable to improve the PAE of a power amplifier system over a range of power levels, without sacrificing the linearity and performance of the power amplifier system over the range of power output levels.

SUMMARY

Embodiments of a power amplifier include a plurality of amplification paths in which at least one amplification path is selectively enabled and disabled, wherein each amplification path includes an output impedance modification element and an output phase shift element that is operable independently from the output impedance modification element, and wherein the output impedance modification element in each amplification path provides selective impedance for each amplification path.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable communication device, such as a portable cellular telephone or a personal digital assistant (PDA), the multi-mode high efficiency linear power amplifier, also referred to in an alternative embodiment as the balanced linear power amplifier, can be used in any device or system that amplifies a transmit signal using at least two power amplification paths. The multi-mode high efficiency linear power amplifier can be implemented as part of an integrated module that contains other circuit elements, or can be implemented as a discrete power amplification module.

The multi-mode high efficiency linear power amplifier can be implemented in hardware, software, or a combination of hardware and software. When implemented in hardware, the multi-mode high efficiency linear power amplifier can be implemented using specialized hardware elements and control logic. When the multi-mode high efficiency linear power amplifier is implemented partially in software, or implemented in a system that employs software control of various elements or components the software portion can be used to precisely control the various components of the multi-mode high efficiency linear power amplifier. The software can be stored in a memory and executed by a suitable instruction execution system (microprocessor). The hardware implementation of the multi-mode high efficiency linear power amplifier can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for multi-mode high efficiency linear power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Figure 1:
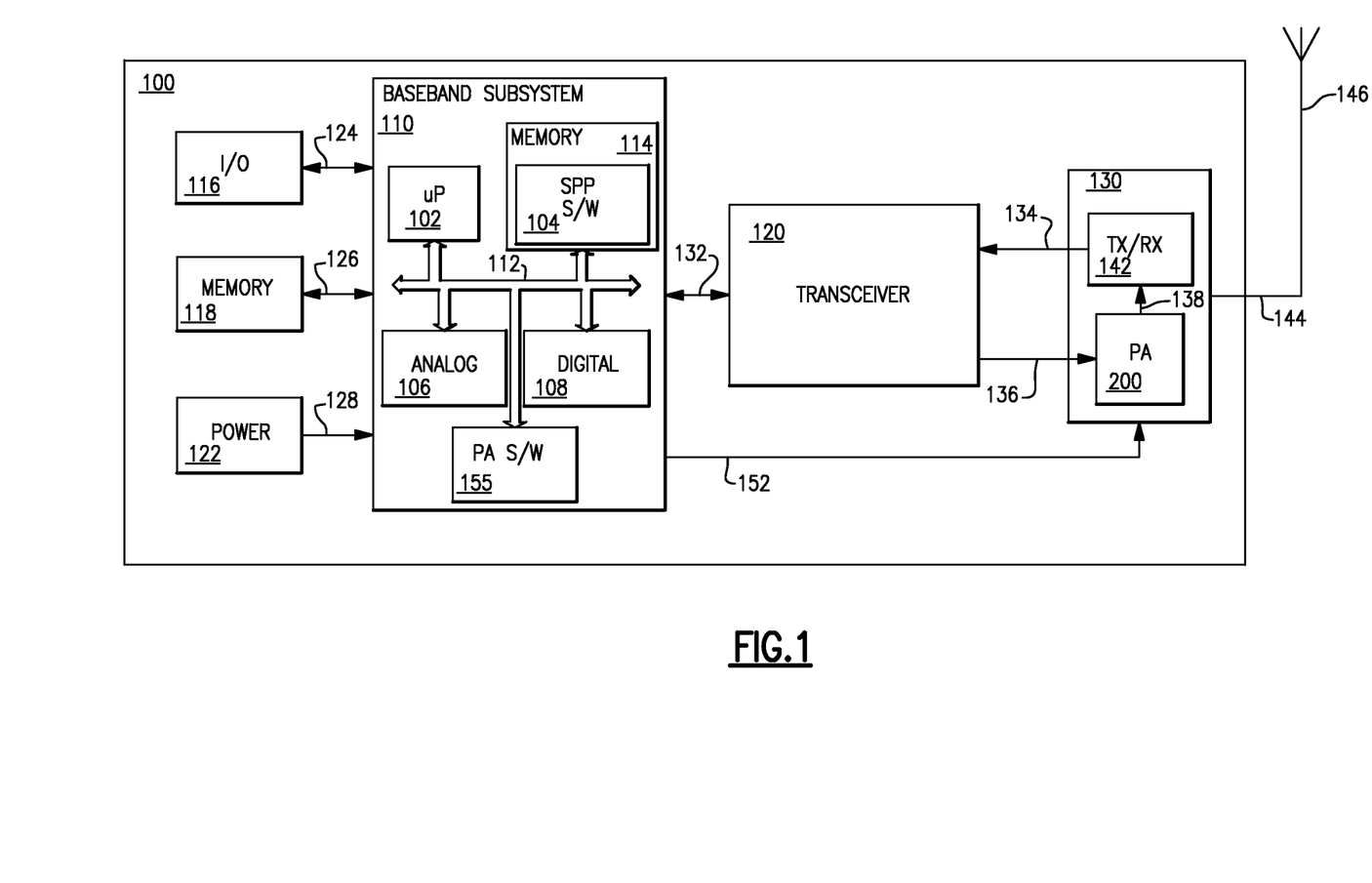
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the multi-mode high efficiency linear power amplifier can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the multi-mode high efficiency linear power amplifier can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the multi-mode high efficiency power amplifier are implemented in software, then the baseband subsystem 110 also includes power amplifier software 155, which may cooperate with control logic that can be executed by the microprocessor 102, or by another processor, to control the operation of the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented as a multi-mode high efficiency linear power amplifier, and in the implementation to be described below, will be shown as being implemented using two amplification paths. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides a power, or mode selection, signal over connection 152 to the power amplifier 200. The mode selection signal determines whether one or more amplification paths within the power amplifier 200 are enabled.

Figure 2:
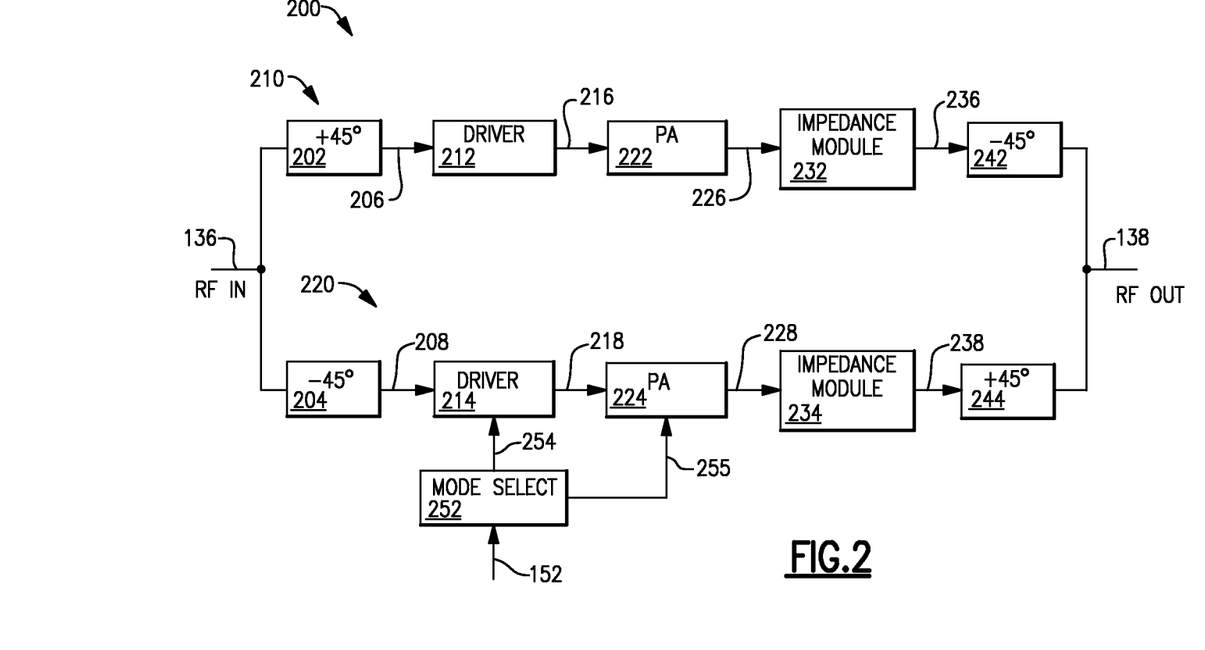
FIG. 2 is a simplified block diagram illustrating an embodiment of a multi-mode high efficiency linear power amplifier.

FIG. 2 is a simplified block diagram illustrating an embodiment of a multi-mode high efficiency linear power amplifier. In FIG. 2, the multi-mode high efficiency linear power amplifier is shown as implemented using two amplification paths.

However, other embodiments of the multi-mode high efficiency linear power amplifier can be implemented using more than two amplification paths.

The power amplifier 200 is generally referred to as a "balanced amplifier." An example of the design, construction and operation of a balanced amplifier can be found in U.S. Pat. No. 6,954,623, entitled "Load Variation Tolerant Radio Frequency (RF) Amplifier," which is assigned to the assignee of this application and which is incorporated herein in its entirety by reference. An example of a balanced amplifier is also described in co-pending, commonly assigned U.S. patent application Ser. No. 11/684,431, filed on Mar. 9, 2007, entitled "High-Efficiency Load Insensitive Power Amplifier," which is assigned to the assignee of this application, and which is incorporated herein in its entirety by reference.

The power amplifier 200 includes a first amplification path 210 and a second amplification path 220. Two amplification paths are shown for example only. Other embodiments of the multi-mode high efficiency linear power amplifier, having more that two amplification paths, are possible. A radio frequency (RF) input signal is provided over connection 136 to the first amplification path 210 and to the second amplification path 220. As will be described in detail below, in a dual-mode power amplifier system, both amplification paths 210 and 220 can be activated when high power mode is selected, and only one amplification path, e.g., first amplification path 210, can be enabled when a low power mode is selected.

Each amplification path includes a respective phase shift element. The first amplification path 210 includes a phase shift element 202 and the second amplification path 220 includes a phase shift element 204. In an embodiment, the phase shift element 202 provides a +45° phase shift and the phase shift element 204 provides a −45° phase shift. In such an embodiment, the first amplification path 210 is 90° out of phase with respect to the second amplification path 220. However, other phase shift relationships may be established between the amplification path 210 and the amplification path 220, depending on the application.

The output of the phase shift element 202 is provided over connection 206 to a driver circuit 212, and the output of the phase shift element 204 is provided over connection 208 to a driver circuit 214. The driver circuit 212 and the driver circuit 214 can be implemented using a variety of transistor technologies including, for example but not limited to, bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

The output of the driver circuit 212 is provided over connection 216 to power amplifier 222, and the output of the driver circuit 214 is provided over connection 218 to the power amplifier 224. The power amplifier 222 and the power amplifier 224 may include one or more power amplifier stages, and are illustrated in FIG. 2 as single elements for simplicity only. The power amplifier 222 and the power amplifier 224 can be implemented using a variety of technologies including, for example but not limited to, bipolar junction (BJT) technology, heterojunction bipolar transistor (HBT) technology, metal-oxide semiconductor field effect transistor (MOSFET) technology, complementary metal oxide semiconductor (CMOS) technology, or any other transistor technology.

In an embodiment, a mode select element 252, under the control of the baseband subsystem 110, controls whether the driver circuit 214 and power amplifier 224 are active. For example, in a low power mode, because only the first amplification path 210 is active, the mode select element 252 deactivates the driver circuit 214 over connection 254 and power amplifier 224 over connection 255, thereby deactivating the second amplification path 220. In a high power mode, the mode select element 252, in response to a signal received from the baseband subsystem 110 over connection 152, enables the driver circuit 214 and power amplifier 224, thereby enabling the second amplification path 220 in addition to the first amplification path 210.

The output of the power amplifier 222 is provided over connection 226 to an impedance module 232, and the output of the power amplifier 224 is provided over connection 228 to an impedance module 234. The impedance module 232 and the impedance module 234 are sometimes referred to as "matching elements," "output matching elements," or "output impedance modification elements" because they transform the impedance on connections 226 and 228 respectively. The impedance module 232 and the impedance module 234 modify the impedance at their input connections 226 and 228, respectively, to match varying impedance on connections 236 and 238, caused by, for example, varying load conditions at the output of the amplifier on connection 138.

The output of the impedance module 232 is provided over connection 236 to phase shift element 242, and the output of impedance module 234 is provided over connection 238 to phase shift element 244. In this example, the phase shift element 242 provides a −45° phase shift, which is complementary to the phase shift provided by phase shift element 202; and the phase shift element 244 provides a +45° phase shift, which is complementary to the phase shift provided by phase shift element 204. Therefore, the phase relationship of the RF signal at connection 138 is the same as the phase relationship of the RF signal at connection 136. The output of the phase shift element 242 and the output of the phase shift element 244 are combined over connection 138 and provide the output of the power amplifier 200.

In accordance with an embodiment of the multi-mode high inefficiency linear power amplifier, the impedance matching provided by the impedance module 232 is separated from the phase shift provided by the phase shift element 242; and the impedance matching provided by the impedance module 234 is separated from the phase shift provided by the phase shift element 244. By having the output impedance matching and phase shifting provided by separate and independent structures for each amplification path, the output impedance matching and phase balance of the two amplification paths can be simultaneously and independently maximized. Further, the use of a costly and inefficient Wilkinson power combiner can be eliminated. Eliminating a Wilkinson power combiner eliminates at least one inductance and at least one inherently lossy resistance typically present in a Wilkinson power combiner, thus reducing component count and cost, while improving the efficiency of the power amplifier 200 over previous implementations. Previous implementations combine the output impedance matching and phase shifting in a single structure, and use a Wilkinson power combiner to combine the amplification paths. The architecture of the power amplifier 200 reduces signal loss, improves the impedance matching for each amplification path, provides an accurate phase balance between and among each amplification path, and improves the power added efficiency (PAE) of the power amplifier 200 at all power levels.

Further, in an embodiment, the first amplification path 210 provides gain expansion, while the second amplification path 220 provides gain compression. In this manner, the architecture of the power amplifier 200 inherently cancels third-order intermodulation intercept point (IMD3) products, thus providing good power amplifier linearity and thus improving power added efficiency at peak power level when both amplification paths 210 and 220 are active.

When operating in a low power mode, in which the second amplification path 220 is deactivated, the impedance module 232 in the first amplification path 210 provides high impedance at connection 226, thus improving power added efficiency at low power levels. However, when high power mode is selected in which the first amplification path 210 and the second application path 220 are both active, the gain expansion provided by the first amplification path 210 and the gain compression provided by the second amplification path 220, together with the ability to independently alter the impedance on connection 226 and on connection 228, improve the power added efficiency of the power amplifier 200 at high power output. Specifically, the impedance at connection 226 can be different than the impedance at connection 228. However, the impedance at connections 236, 238 and 138 can be maintained at a nominal 50 ohm level. In this manner, separating the output impedance matching from the phase shifting for each amplification path provides the flexibility to provide different impedance at each amplification path, while allowing the desired 50 ohm impedance at connection 138, while also maintaining an accurate phase balance between the first amplification path 210 and the second amplification path 220.

Figure 3:
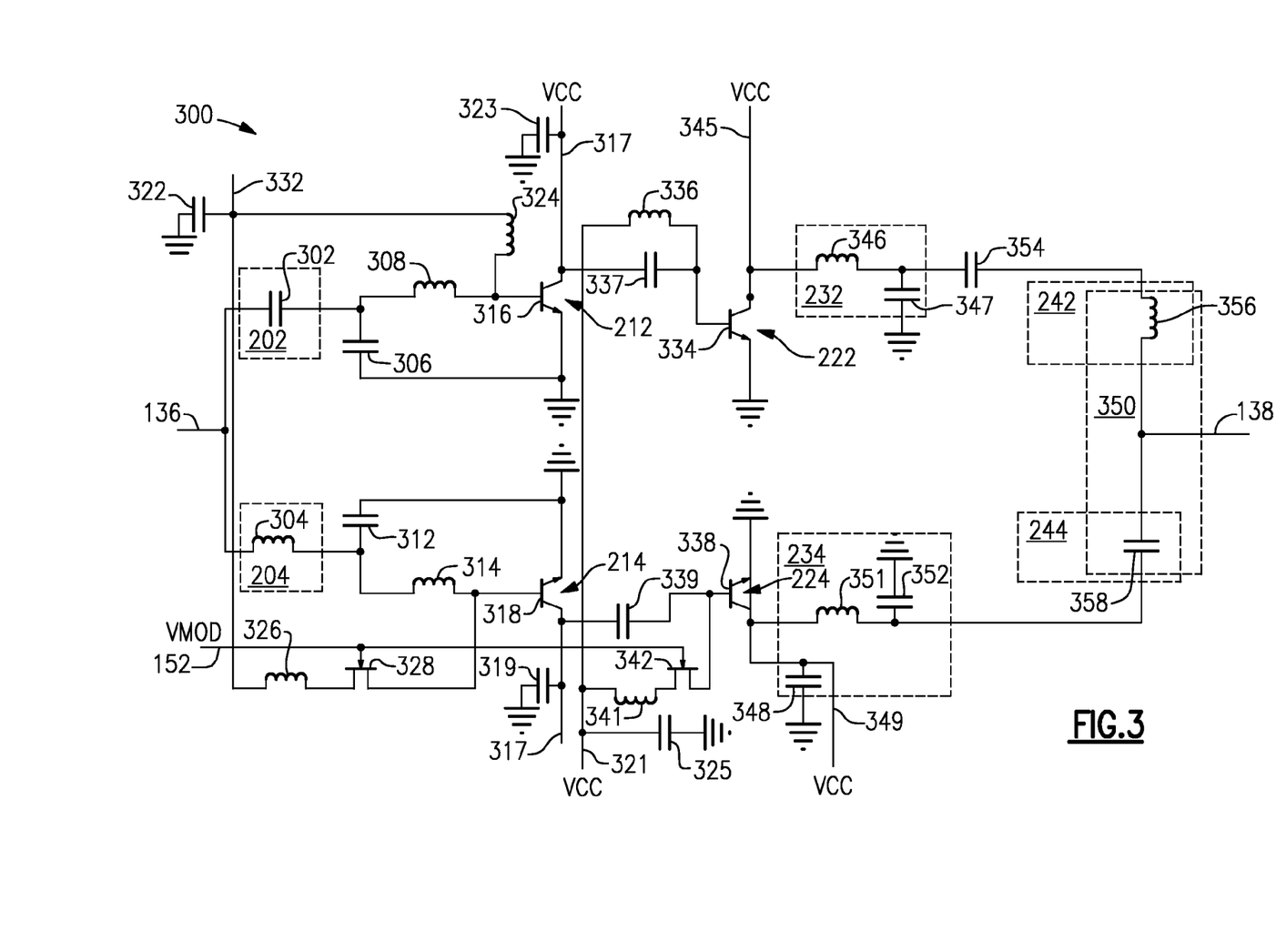
FIG. 3 is a schematic diagram illustrating an embodiment of an implementation of the multi-mode high efficiency linear power amplifier of FIG. 2.

FIG. 3 is a schematic diagram illustrating an embodiment of an implementation of the multi-mode high efficiency linear power amplifier of FIG. 2.

The implementation 300 is one example of an implementation of the power amplifier 200 of FIG. 2. Other implementations are possible. The implementation 300 includes the phase shifter 202 and the phase shifter 204 that each receive the RF input signal over connection 136. The phase shifter 202 comprises a capacitance 302 and the phase shifter 204 comprises an inductance 304. In the implementation shown in FIG. 3, the capacitance 302 provides a +45° phase shift to the input signal on connection 136 and the inductance 304 provides a −45° phase shift to the input signal on connection 136. As used herein, the term "capacitance" refers to a capacitor, or any other element that can provide an electrical capacitance. Similarly, the term "inductance" refers to an inductor, or any other element that can provide an electrical inductance. Further, the term "resistance" includes a resistor, or any other device that can provide an electrical resistance.

The capacitance 302 is coupled to a capacitance 306. The capacitance 306 is coupled to an inductance 308. The inductance 308 is coupled to a base terminal of a transistor 316. The transistor 316 is a heterojunction bipolar transistor (HBT) implementation of the driver 212 of FIG. 2. The base terminal of the transistor 316 is biased at node 332 through an inductance 324 which is de-coupled by a capacitance 322.

The inductance 304 is coupled to a capacitance 312 and to an inductance 314. The inductance 314 is coupled to a base terminal of a transistor 318. The transistor 318 illustrates an HBT implementation of the driver circuit 214 of FIG. 2. A field effect transistor (FET) 328 is coupled to the base of the transistor 318 to provide mode selection. The field effect transistor 328 is also coupled through an inductance 326 to the node 332. A gate terminal of the FET 328 is connected to a mode select signal on connection 152 to control the bias supply to the base of the transistor 318, thereby enabling or disabling the second amplification path.

The collector terminal of the transistor 316 is coupled to a voltage source 317 across a capacitance 323. The collector terminal of the transistor 316 is also coupled through a capacitance 337 to the base terminal of a transistor 334. The transistor 334 illustrates an HBT implementation of the power amplifier 222 of FIG. 2. The base terminal of the transistor 334 is biased through an inductance 336 to the bias node 321. A capacitance 325 is connected to the bias node 321.

The collector terminal of the transistor 318 is connected to a voltage source 317 across a capacitance 319. The collector terminal of the transistor 318 is also coupled through a capacitance 339 to the base terminal of a transistor 338. The transistor 338 is an HBT implementation of the power amplifier 224 of FIG. 2. The base terminal of the transistor 338 is biased through a field effect transistor 342 and an inductance 341 to the bias node 321. A gate terminal of the FET 342 is connected to the mode select signal on connection 152 to enable or disable the transistor 338.

The collector terminal of the transistor 334 is connected to the impedance module 232. The impedance module 232 comprises an inductance 346 and a capacitance 347. The output of the impedance module 232 is coupled through a capacitance 354 to the phase shift element 242. The phase shift element 242 comprises an inductance 356. The collector terminal of the transistor 334 is also connected to a voltage source on connection 345.

The collector terminal of the transistor 338 is connected to the impedance module 234. The impedance module 234 comprises an inductance 351 and a capacitance 352. The output of the impedance module 234 is coupled to the phase shift element 244. The phase shift element 244 comprises a capacitance 358. The collector terminal of the transistor 338 is also connected across a capacitance 348 to a voltage source on connection 349.

The inductance 356 provides a −45° phase shift and the capacitance 358 provides a +45° phase shift. The −45° phase shift provided by the phase shift element 242 is complementary to the +45° phase shift provided by the phase shift element 202. The +45° phase shift provided by the phase shift element 244 is complementary to the −45° phase shift provided by the phase shift element 204. The inductance 356 in the phase shift element 242 and the capacitance 358 in the phase shift element 244 form a single node combiner 350 in which the single node provides the radio frequency output over connection 138.

In accordance with an embodiment of the multi-mode high efficiency linear power amplifier, the combiner 350 comprises a single inductance 356, which forms the phase shift element 242, and a single capacitance 358, which forms the phase shift element 244. The combiner 350 does not include a resistance, which could impart signal loss. Accordingly, the output of the power amplifier implementation 300 provides superior phase balance, output impedance matching, and power added efficiency using a minimal number of components.

By separating for each amplification path the impedance matching provided by the impedance modules 232 and 234, from the phase shift provided by the phase shift elements 242 and 244, superior phase balance among amplification paths and impedance matching for each amplification path is provided. The values of the inductance 346 and the capacitance 347 in the impedance module 232 can be individually selected to provide a selective and variable impedance at the collector terminal of the transistor 334. Similarly, the values of the inductance 351, the capacitance 348 and the capacitance 352 in the impedance module 234 can be individually selected to provide a selective and variable impedance at the collector terminal of the transistor 338. In an embodiment, approximately 6-8 ohm impedance can be provided at the collector terminal of the transistor 334 and at the collector terminal of the transistor 338, depending on the output power level.

Further, the impedance presented to the collector terminal of the transistor 334 can be the same or different than the impedance presented to the collector terminal of the transistor 338. However, the impedance at the input to the phase shift element 242, the impedance at the input to the phase shift element 244, and the impedance at the output on connection 138 can be maintained at a nominal value, which can be approximately 50 ohm in this embodiment. In this manner, separating the output impedance matching from the phase shifting for each amplification path provides the flexibility to have a different impedance value at each amplification path, while allowing the desired nominal 50 ohm impedance at connection 138, and while also maintaining an accurate phase balance between the first amplification path 210 and the second amplification path 220 through the implementation of the independent phase shift elements 242 and 244.

Figure 4:
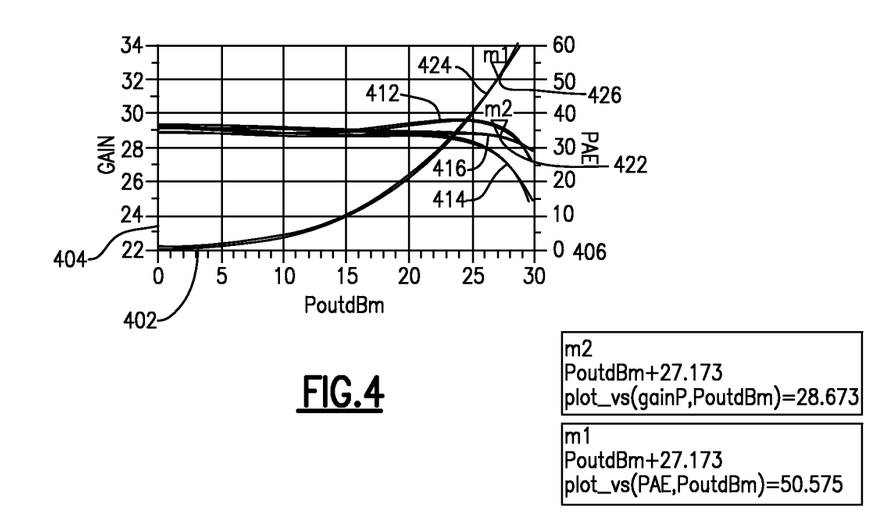
FIG. 4 is a graphical illustration showing the gain compression and gain expansion achieved by the multi-mode high efficiency linear power amplifier of FIG. 2.

FIG. 4 is a graphical illustration 400 showing the gain compression and gain expansion achieved by the two paths of the multi-mode high efficiency linear power amplifier of FIG. 2. The horizontal axis 402 represents amplifier output power in dBm (PoutdBm), the left vertical axis 404 represents power amplifier gain in dB, and the right vertical axis 406 represents power added efficiency (% PAE).

The trace 412 represents the gain of the first amplification path 210 (FIG. 2), the trace 414 represents the gain of the second amplification path 220 (FIG. 2) and the trace 416 represents the total gain of both amplification paths 210 and 220. The point 422 on the trace 416 represents a gain of 28.673 dB at a power output of 27.173 dBm. The trace 424 indicates power added efficiency of both amplification paths, and the point 426 illustrates a PAE of 50.575% at a power output of 27.173 dBm.

Figure 5:
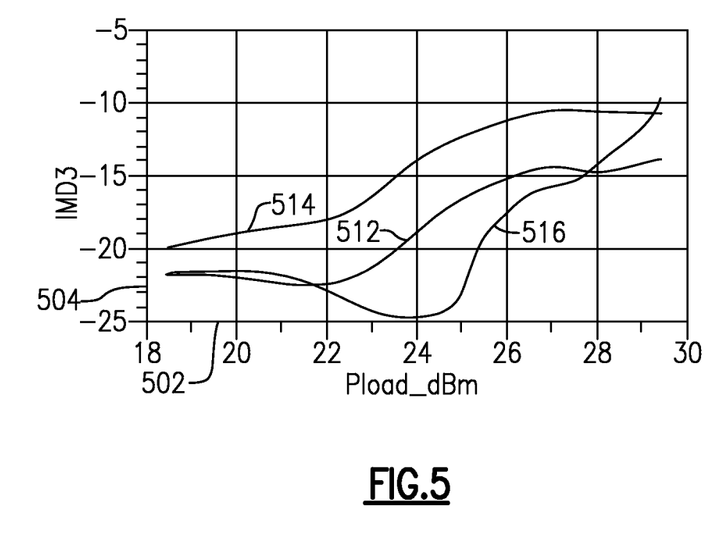
FIG. 5 is a graphical illustration showing the cancellation of third-order intermodulation intercept point (IMD3) products achieved by the multi-mode high efficiency linear power amplifier of FIG. 2.

FIG. 5 is a graphical illustration showing the cancellation of third-order intermodulation intercept point (IMD3) products achieved by the multi-mode high efficiency linear power amplifier of FIG. 2. The horizontal axis 502 represents power amplifier load output power (Pload_dBm) and the left vertical axis represents third order intermodulation intercept point (IMD3) in dBm.

The trace 512 represents the IMD3 of the first amplification path 210 (FIG. 2), the trace 514 represents the IMD3 of the second amplification path 220 (FIG. 2), and the trace 516 represents the combined IMD3 of the first amplification path 210 and the second amplification path 220. Since the gain expansion provided by the first amplification path 210 (FIG. 2) and gain compression provided by the second amplification path 220 (FIG. 2) generates inter-modulation (IM) signals with opposite phase, they cancel each other. Therefore, the overall IMD3 shown at trace 516 has a significantly improved IMD3 level over the IMD3 level of the first amplification path 210 and the IMD3 level of the second amplification path 220. As shown, at an output load of approximately 24 dBm, the combined IMD3 of both amplification paths is minimized.

Figure 6:
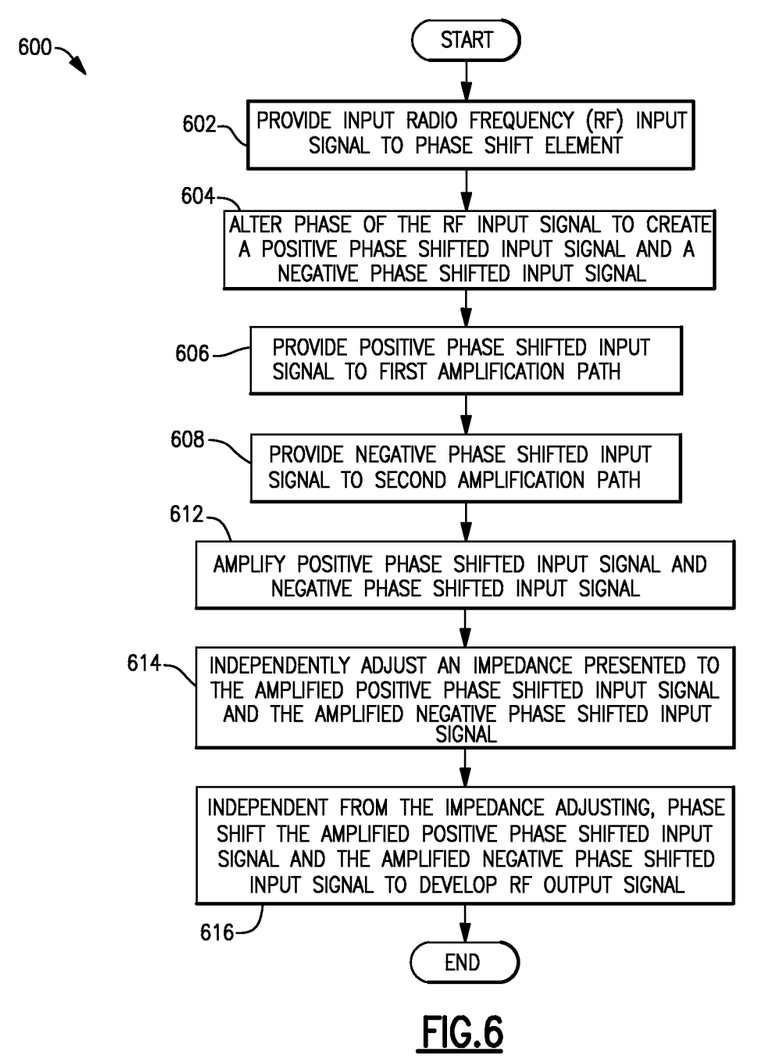
FIG. 6 is a flow chart describing the operation of an embodiment of the multi-mode high efficiency linear power amplifier of FIG. 2.

FIG. 6 is a flow chart describing the operation of an embodiment of the multi-mode high efficiency linear power amplifier of FIG. 2. The blocks in the flow chart can be performed in or out of the order shown.

In block 602, an input RF signal is provided to a phase shift element, which acts to split the input signal into two signals having a phase relationship. In block 604, the phase of the input RF signal is altered to create a positive (+) phase shifted input signal and a negative (−) phase shifted input signal. In block 606, the positive (+) phase shifted input signal is provided to a first amplification path. In block 608, the negative (−) phase shifted input signal is provided to a second amplification path.

In block 612, the positive (+) phase shifted input signal and the negative (−) phase shifted input signal are amplified. In block 614, an impedance presented to the amplified positive (+) phase shifted input signal and an impedance presented to the amplified negative (−) phase shifted input signal are independently adjusted.

In block 616, separate from the impedance adjusting, the phase of the amplified positive (+) phase shifted input signal and the phase of the amplified negative (−) phase shifted input signal are shifted to develop an amplified RF output signal. The phase shifting also combines the amplified positive (+) phase shifted input signal and the amplified negative (−) phase shifted input signal using a single inductance and a single capacitance, without the use of a lossy resistance. Providing independent output impedance matching for each amplification path separately from the output phase shifting allows separate adjustment of both the impedance and the phase relationship between the two amplification paths, thus allowing each of these parameters to be independently optimized.

Further, when operating in a low power mode, in which the second amplification path 220 (FIG. 2) is disabled, the impedance module 232 in the first amplification path 210 provides high impedance at connection 226, thus improving power added efficiency at low power levels. However, when high power mode is selected in which the first amplification path 210 and the second application path 220 are both enabled, the gain expansion provided by the first amplification path 210 and the gain compression provided by the second amplification path 220, together with the ability to alter the impedance on connection 226 and connection 228, improve the power added efficiency at high power output.

While various embodiments of the invention have been described, it will be apparent to those of ordinary skill in the art that many more embodiments and implementations are possible that are within the scope of the invention. For example, the invention is not limited to a specific type of communication device or transceiver. Embodiments of the invention are applicable to different types of communication devices and transceivers.

What is claimed is:

1. A power amplifier comprising:
   a first amplification path including a power amplification element having one or more power amplification stages, an output impedance modification element, and an output phase shift element being only one inductance, the output impedance modification element coupled between an output of a final stage of the power amplification element and a corresponding intermediate node, the output phase shift element coupled between the corresponding intermediate node and an output node; and
   a second amplification path including a power amplification element having one or more power amplification stages, an output impedance modification element, and an output phase shift element being only one capacitance, the output impedance modification element coupled between an output of a final stage of the power amplification element and a corresponding intermediate node, the output phase shift element directly coupled between the corresponding intermediate node and the output node that is common to the first and second amplification paths, the output impedance modification element being a separate structure from the output phase shift element in each amplification path allowing an impedance at each of the intermediate nodes to be substantially the same as an impedance at the output node.

2. The power amplifier of claim 1 wherein the first amplification path further includes an input phase shift element configured to apply a positive phase shift to a radio frequency (RF) input signal.

3. The power amplifier of claim 2 wherein the power amplification element of the first amplification path is configured to receive and amplify the positive phase shifted signal of the first amplification path.

4. The power amplifier of claim 3 wherein the output impedance modification element of the first amplification path is configured to alter an impedance at the output of the final stage of the power amplification element of the first amplification path.

5. The power amplifier of claim 4 wherein the output phase shift element of the first amplification path is configured to apply a negative phase shift to the amplified positive phase shifted signal of the first amplification path.

6. The power amplifier of claim 1 wherein the second amplification path further includes an input phase shift element configured to apply a negative phase shift to the radio frequency (RF) input signal.

7. The power amplifier of claim 6 wherein the power amplification element of the second amplification path is configured to receive and amplify the negative phase shifted signal of the second amplification path.

8. The power amplifier of claim 7 wherein the output impedance modification element of the second amplification path is configured to alter an impedance at the output of the final stage of the power amplification element of the second amplification path.

9. The power amplifier of claim 8 wherein the output phase shift element of the second amplification path is configured to apply a positive phase shift to the amplified negative phase shifted signal of the second amplification path.

10. A portable communication device comprising:
a baseband subsystem configured to convert an input signal into a baseband information signal;
a transceiver configured to receive the baseband information signal and modulate and upconvert the received baseband information signal to provide an upconverted signal;
a power amplifier configured to amplify the upconverted signal and including a plurality of amplification paths in which at least one amplification path is selectively enabled and disabled and at least one other amplification path operates whether the at least one amplification path is enabled or disabled, each amplification path including an amplifier element having one or more amplifier stages, an output impedance modification element, and an output phase shift element being one of an inductance and another output phase shift element being only one capacitance, the output impedance modification element coupled between an output of a final stage of the amplifier element and an intermediate node, the other output phase shift element directly coupled between the intermediate node and an output node that is common to the plurality of amplification paths, the output impedance modification element being a separate structure from the output phase shift element in each amplification path allowing an impedance at each of the intermediate nodes to be substantially the same as an impedance at the output node; and
an antenna configured to receive and transmit the amplified signal.

11. The portable communication device of claim 10 wherein a first amplification path operates whether a second amplification path is enabled or disabled, and the output impedance modification element associated with the first amplification path provides a high impedance in the first amplification path when the second amplification path is disabled.

12. The portable communication device of claim 10 wherein a first amplification path operates whether a second amplification path is enabled or disabled, and the output impedance modification element associated with the first amplification path provides a low impedance in the first amplification path and the output impedance modification element associated with the second amplification path provides a low impedance in the second amplification path when the second amplification path is enabled.

13. The portable communication device of claim 10 wherein the output impedance modification element associated with a first amplification path provides an impedance that is different from an impedance provided by the impedance modification element associated with a second amplification path.

14. A method for amplifying a radio frequency signal, the method comprising: providing an input RF signal to a power amplifier including one or more amplifier stages in a first amplification path and one or more amplifier stages in a second amplification path;
amplifying the input RF signal such that a first amplified signal is provided by a final stage of the power amplifier in the first amplification path and such that a second amplified signal is provided by a final stage of the power amplifier in the second amplification path;
presenting a nominal impedance to the first amplified signal and the second amplified signal; phase shifting using only one inductance the first amplified signal presented with the nominal impedance and phase shifting using only on one capacitance the second amplified signal presented with the nominal impedance to provide an output RF signal, the impedance presented to the first amplified signal and the second amplified signal substantially the same as an impedance at the output RF signal, presenting the nominal impedance being separate from phase shifting for each of the first and second amplification paths; and
operating the first amplification path whether the second amplification path is enabled or disabled.

15. The method of claim 14 wherein providing the RF input signal to the power amplifier includes:
providing the RF input signal to a phase shift element; and
altering the phase of the RF input signal such that a positive phase shifted signal is provided to the power amplifier for the first amplification path and a negative phase shifted signal is provided to the power amplifier for the second amplification path.

16. The method of claim 15 wherein providing the RF input signal to the power amplifier further includes amplifying the positive phase shifted signal to create the first amplified signal and amplifying the negative phase shifted signal to create the second amplified signal.

17. The method of claim 14 wherein phase shifting the first amplified signal presented with the nominal impedance and the second amplified signal presented with the nominal impedance is performed independent of presenting a nominal impedance to the first amplified signal and the second amplified signal.

* * * * *